United States Patent
Rouviere et al.

(10) Patent No.: US 9,685,778 B2
(45) Date of Patent: Jun. 20, 2017

(54) OVERVOLTAGE PROTECTION COMPONENT

(71) Applicant: STMicroelectronics (Tours) SAS, Tours (FR)

(72) Inventors: Mathieu Rouviere, Tours (FR); Laurent Moindron, Vernou sur Brenne (FR); Christian Ballon, Tours (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 135 days.

(21) Appl. No.: 14/725,342

(22) Filed: May 29, 2015

(65) Prior Publication Data
US 2015/0380925 A1 Dec. 31, 2015

(30) Foreign Application Priority Data

Jun. 26, 2014 (FR) ...................................... 14 55999

(51) Int. Cl.
*H02H 3/20* (2006.01)
*H01L 29/732* (2006.01)
(Continued)

(52) U.S. Cl.
CPC ........... *H02H 3/20* (2013.01); *H01L 27/0248* (2013.01); *H01L 27/0629* (2013.01); *H01L 27/0761* (2013.01); *H01L 28/20* (2013.01); *H01L 29/732* (2013.01); *H01L 29/7322* (2013.01); *H01L 29/7395* (2013.01); *H01L 29/7827* (2013.01);
(Continued)

(58) Field of Classification Search
CPC ......................................................... H02H 3/20
See application file for complete search history.

(56) References Cited

U.S. PATENT DOCUMENTS 6,479,841 B1 * 11/2002 Simonnet ............ H01L 29/7404
257/146
2001/0002870 A1 * 6/2001 Pezzani ................. H01L 21/761
361/91.5
(Continued)

FOREIGN PATENT DOCUMENTS

EP  0677874 A1  10/1995
EP  0742591 A1  11/1996
(Continued)

OTHER PUBLICATIONS

EP Search Report and Written Opinion for EP15172650.2 dated Oct. 20, 2015 (7 pages).
(Continued)

*Primary Examiner* — Scott Bauer
(74) *Attorney, Agent, or Firm* — Gardere Wynne Sewell LLP

(57) ABSTRACT

An integrated circuit includes a vertical Shockley diode and a first vertical transistor. The diode is formed by, from top to bottom of a semiconductor substrate, a first region of a first conductivity type, a substrate of a second conductivity type, and a second region of the first conductivity type having a third region of the second conductivity type formed therein. The vertical transistor is formed by, also from top to bottom, a portion of the second region and a fourth region of the second conductivity type. The third and fourth regions are electrically connected to each other.

19 Claims, 4 Drawing Sheets

(51) Int. Cl.
  *H01L 27/07*  (2006.01)
  *H01L 29/87*  (2006.01)
  *H01L 27/02*  (2006.01)
  *H01L 27/06*  (2006.01)
  *H01L 49/02*  (2006.01)
  *H01L 29/739*  (2006.01)
  *H01L 29/78*  (2006.01)
  *H01L 29/872*  (2006.01)

(52) U.S. Cl.
  CPC ............ *H01L 29/87* (2013.01); *H01L 29/872* (2013.01); *H01L 27/0262* (2013.01)

(56) References Cited

U.S. PATENT DOCUMENTS

| | | | |
|---|---|---|---|
| 2010/0072915 A1* | 3/2010 | Chu | ................... H05B 33/0815 315/291 |
| 2012/0161200 A1 | 6/2012 | Hague et al. | |
| 2012/0267679 A1 | 10/2012 | Menard | |
| 2014/0293493 A1 | 10/2014 | Heurtier et al. | |

FOREIGN PATENT DOCUMENTS

| | | |
|---|---|---|
| EP | 0827204 A2 | 3/1998 |
| EP | 1098355 A1 | 5/2001 |

OTHER PUBLICATIONS

INPI Search Report and Written Opinion for FR 1455999 dated Mar. 23, 2015 (6 pages).

\* cited by examiner

US 9,685,778 B2

OVERVOLTAGE PROTECTION COMPONENT

PRIORITY CLAIM

This application claims the priority benefit of French Patent application number 1455999, filed on Jun. 26, 2014, the disclosure of which is hereby incorporated by reference.

TECHNICAL FIELD

The present disclosure relates to a component of protection against overvoltage.

BACKGROUND

A component of protection against overvoltage is a component which turns on when the voltage thereacross exceeds a given threshold, called breakdown voltage, and generally designated as $V_{BR}$. A protection component is for example of break-over type.

A disadvantage of break-over protection components is that they only turn back off if the voltage thereacross is such that the current flowing therethrough becomes smaller than a hold current Ih. A device enabling to turn back off such components by shorting them as soon as an overvoltage is over has thus been provided. Such a protection device is described in French Application for Patent No. 13/52864 (incorporated by reference) filed on Mar. 29, 2013.

SUMMARY

An embodiment provides a component comprising a vertical Shockley diode comprising from top to bottom a first region of a first conductivity type, a substrate of a second conductivity type, a second region of the first conductivity type having a third region of the second conductivity type formed therein, this component further comprising a first vertical transistor, this transistor comprising from top to bottom a portion of said substrate separated from the Shockley diode by a vertical wall, a portion of the second region, a fourth region of same nature as the third region, formed in said portion of the second region, the third region being connected to the fourth region.

According to an embodiment, the component further comprises a second transistor of same structure as the first transistor.

According to an embodiment, the first transistor is located in a corner of the chip containing the Shockley diode.

Another embodiment provides a protection system comprising a component such as hereabove, a switch connected in parallel with the Shockley diode, a resistor having a first terminal connected to the upper main terminal of the first transistor, and a voltage source connected to the second terminal of said resistor, the upper main terminal of the first transistor being connected to a circuit of detection and control of the switch.

According to an embodiment, the switch is controlled to turn on and off according to the voltage between the upper main terminal of the first transistor and the third region.

According to an embodiment, the system further comprises a second transistor of same structure as the first transistor, and a second resistor having a first terminal connected to the upper main terminal of the second transistor, and having its second terminal connected to the voltage source, the upper main terminal of the second transistor being connected to the circuit of detection and control of the switch.

According to an embodiment, the switch is controlled to be turned on according to the first voltage between the upper main terminal of the first transistor and the third region, and the switch is controlled to be turned off according to the second voltage between the upper main terminal of the second transistor and the third region.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION OF THE DRAWINGS

Figure 1:
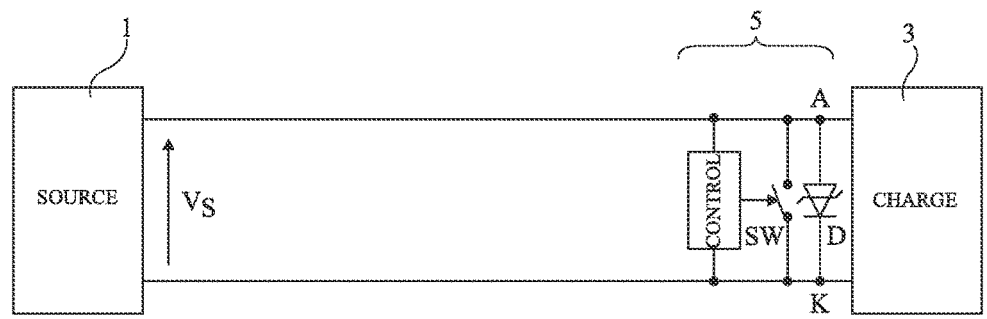
FIG. 1 shows an example of a power supply line connecting a source to a load, protected by a protection device.

For clarity, the same elements have been designated with the same reference numerals in the various drawings and, further, as usual in the representation of integrated circuits, the various drawings are not to scale.

FIG. 1 shows an example of a power supply line connecting a source 1 to a load 3, protected by a protection device 5 such as that described in French Application for Patent No. 13/52864. The source imposes a voltage $V_S$ across the line. Device 5 is placed close to the load to protect it at best from overvoltage capable of occurring on the line, for example, after lightning surges.

Protection device 5 comprises between two terminals A and K the parallel assembly of: a protection diode D of a break-over type, a switch SW, and a circuit (CONTROL) for controlling switch SW.

Protection device of FIG. 1 operates as follows.

The protection diode has a breakdown voltage greater than voltage $V_S$. In the absence of an overvoltage, the diode is non-conductive. Switch SW is then off. When an overvoltage appears, the protection diode becomes conductive. Once the overvoltage has passed, source 1 imposes in diode D a current greater than hold current Ih. Switch SW is then turned on, which branches the current flowing through diode D into switch SW. This normally results in the current in diode D becoming smaller than hold current Ih and, when switch SW is turned back off, the diode locks back.

The switch SW is controlled to turn it on when voltage $V_{AK}$ across the diode becomes smaller than a first threshold voltage and switch SW is controlled to turn it off when voltage $V_{AK}$ becomes smaller than a second threshold voltage.

The first threshold voltage corresponds to a value greater than the voltage imposed by source 1 across the diode when this diode is conductive.

The second threshold voltage is smaller than the voltage existing across the diode when it conducts a current equal to hold current Ih.

Further, it has been experimentally observed that towards the end of the overvoltage peak, the current in the diode does not follow voltage $V_{AK}$ but tends to exhibit a secondary peak. Thus, if switch SW is turned on depending on voltage $V_{AK}$, the current in this switch will tend to start by increasing, which risks damaging the switch.

It would thus be preferable to refer to the real current in diode D to control the turning-on of switch SW, to turn on the switch when the current in the diode will effectively be in decrease phase.

It would be desirable to turn off switch SW as fast as possible after its turning-on. Experiments conducted by the inventors have shown that if switch SW was opened in the above-indicated conditions (turning off as soon as voltage $V_{AK}$ reaches a value smaller than that corresponding to the flowing of current Ih in the diode), the diode would not always turn back off. The inventors have analyzed the causes of such a failure and impute it to the fact that, at the turning-on of switch SW, high-frequency parasites appear on voltage $V_{AK}$. Thus, if the turning off of switch SW is controlled depending on voltage $V_{AK}$, switch SW risks being controlled to turn off during a voltage dip while the current in diode D is still greater than hold current Ih.

Figure 2:
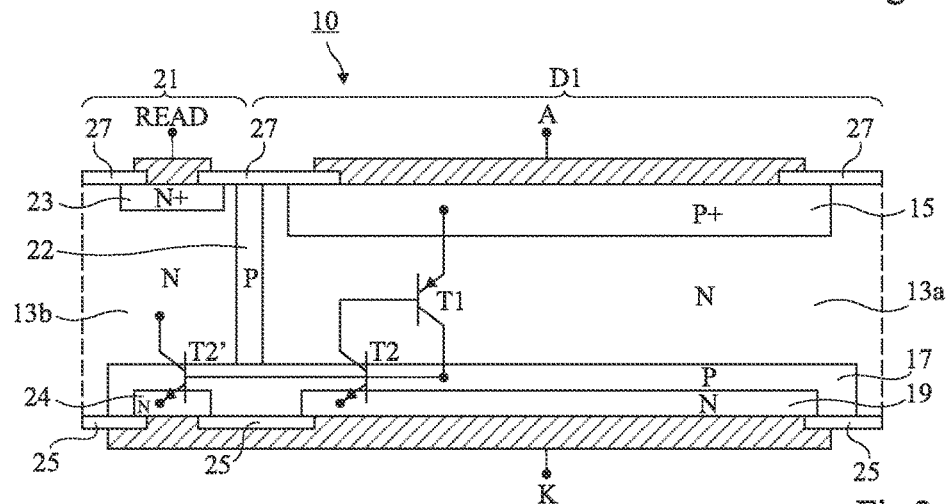
FIG. 2 is a cross-section view showing an embodiment of a component of protection against overvoltage and its electric diagram.

FIG. 2 is a cross-section view showing an embodiment of a component 10 of protection against overvoltages and its electric diagram.

The right-hand portion of FIG. 2 shows a simplified vertical PNPN Shockley diode D1 comprising: a portion 13a of an N-type semiconductor substrate; a P-type region 15 on the upper surface side of portion 13a corresponding to the anode of the diode, which does not touch the left-hand and right-hand edges of portion 13a; a P-type region 17 on the lower surface side of portion 13a which does not touch the right-hand edge of portion 13a; and an N-type region 19 in region 17 corresponding to the diode cathode which does not touch the edge of region 17.

A metallization connected to an anode electrode A is in contact with region 15 and a metallization connected to a cathode electrode K is in contact with region 19.

The left-hand portion of FIG. 2 shows a vertical NPN transistor 21 comprising: a portion 13b of the same substrate as portion 13a separated from portion 13a by a P-type wall 22; a heavily-doped N-type ohmic collector contact region 23 on the upper surface side of portion 13b which does not touch the left-hand edge of portion 13b and wall 22; a P-type region on the lower surface side of portion 13b corresponding to the extension of region 17 which does not touch the left-hand edge of portion 13b; and an emitter region 24 in region 17, of the same type and same doping as region 19, which does not touch the edge of layer 17 and the right-hand edge of the left-hand portion of the drawing.

An emitter metallization connected to electrode K is in contact with N-type region 24. A collector metallization connected to an electrode READ is in contact with substrate portion 13b via region 23. An insulating layer 25 enables to avoid for metallization K to be in contact with the portions of substrate 13a-13b and with layer 17 at the transistor level.

An insulating layer 27 enables to avoid for metallizations READ and A to be in contact with substrate portions 13a-13b.

FIG. 2 further shows the electric diagram of component 10. Shockley diode D1 corresponds to a PNP-type bipolar transistor T1 connected to an NPN-type bipolar transistor T2. The base of transistor T1 is connected to the collector of transistor T2, and the collector of transistor T1 is connected to the base of transistor T2. The emitter of transistor T1 corresponds to region 15 (anode), its base corresponds to portion 13a, and its collector corresponds to region 17. The collector of transistor T2 corresponds to portion 13a, its base corresponds to region 17, and its emitter corresponds to region 19 (cathode).

A transistor T2' corresponds to transistor 21. The base of transistor T2' is connected to the base of transistor T2. The collector of transistor T2' corresponds to substrate portion 13b, its base corresponds to region 17, and its emitter corresponds to region 24.

Given that the collectors, the bases, and the emitters of transistors T2 and T2' are respectively of same type and of same doping and that their bases and their emitters are common or interconnected, transistors T2 and T2' form a current mirror.

Figure 3:
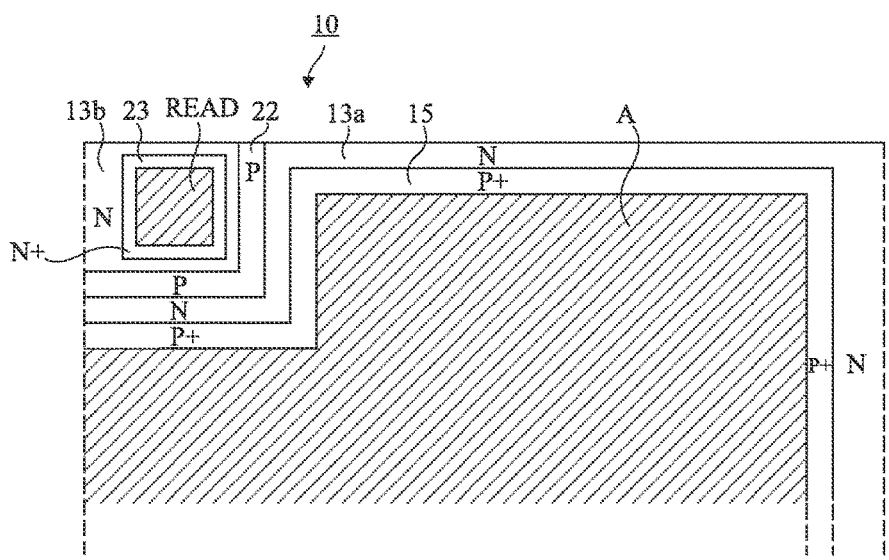
FIG. 3 is a top view of the component shown in cross-section view in FIG. 2.

FIG. 3 is a top view of component 10 shown in cross-section view in FIG. 2. Transistor 21 is located in the top left corner of Shockley diode D1. The surface area of transistor T2' is smaller than the surface area of diode D1. The ratio of the collector surface area of transistor T2' to the collector surface area of transistor T2 is called k, k being a number greater than 1. Since transistors T2 and T2' are assembled as a current mirror, the collector current of transistor T2' will be k times smaller than the collector current of transistor T2.

Figure 4:
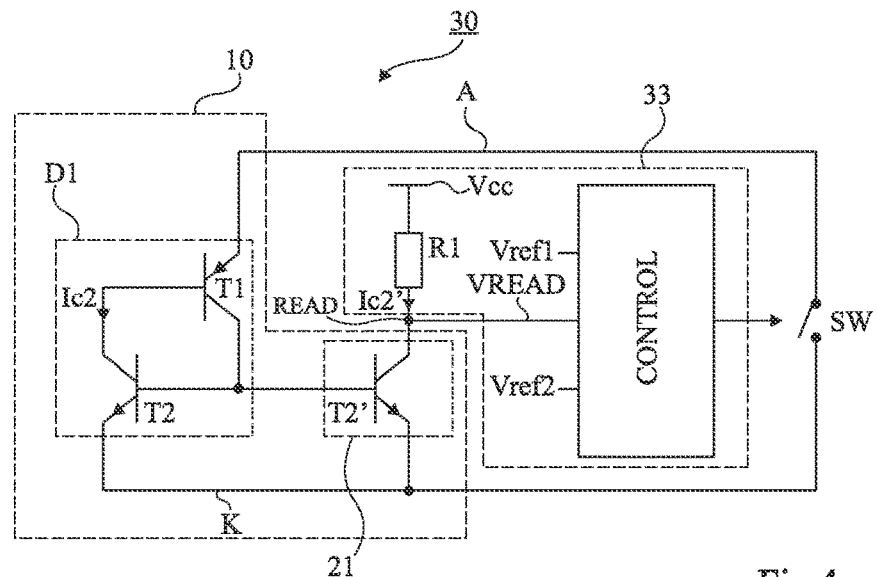
FIG. 4 is an electric diagram of an embodiment of a protection device.

FIG. 4 is an electric diagram of a protection device 30 comprising component 10, a detection and control circuit 33 and a switch SW. Electrodes A and K of component 10 are connected to a power supply line, as in FIG. 1. Detection and control circuit 33 comprises a resistor R1 connecting a voltage source VCC to electrode READ of component 10, and a control circuit CONTROL connected on the one hand to electrode READ and on the other hand to the control of switch SW.

Figure 5:
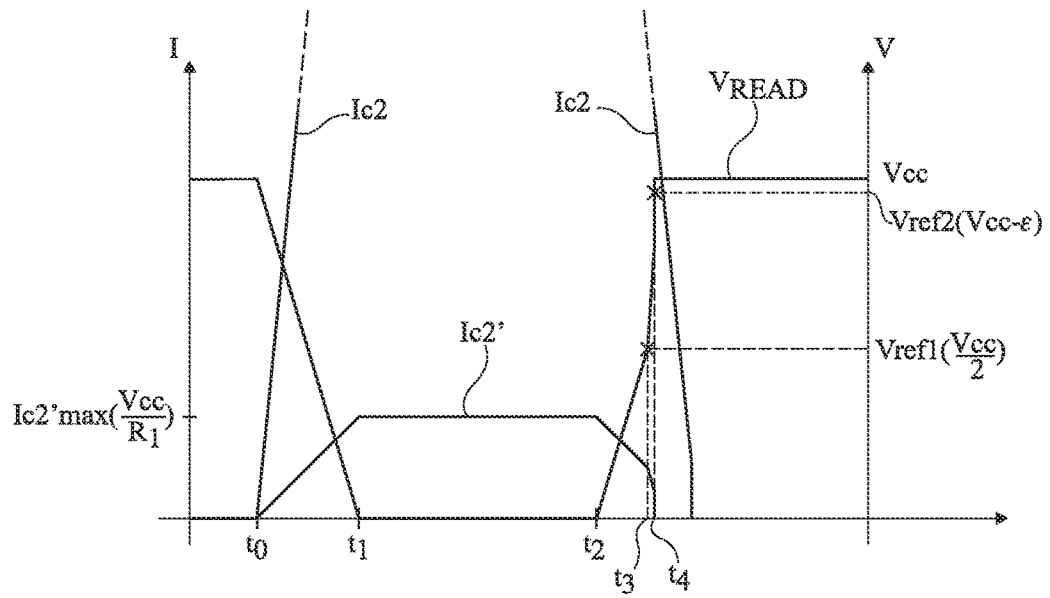
FIG. 5 is a timing diagram showing currents and voltages in the overvoltage protection device of FIG. 4 during an overvoltage.

FIG. 5 is a timing diagram showing collector current Ic2' of transistor T2', collector current Ic2 of transistor T2, and voltage VREAD between electrodes READ and K during an overvoltage.

Protection device 30 operates as follows.

In the absence of an overvoltage, Shockley diode D1 is non-conductive and transistors T1, T2, and T2' are non-conductive. Voltage VREAD is equal to VCC. When an overvoltage appears at a time t0, Shockley diode D1 becomes conductive, the current that it conducts flowing through transistor T2.

Collector current Ic2' of transistor T2' is k times smaller than collector current Ic2 of transistor T2. Further, due to the presence of resistor R1, current Ic2' is clipped at a value Ic2'max=VCC/R1.

From time t0, current Ic2 crossing Shockley D1 increases rapidly and voltage VREAD decreases rapidly.

Time t1 corresponds to the time at which current Ic2 becomes greater than a value k*Ic2'max. From this time on, current Ic2' is equal to value Ic2'max and voltage VREAD is equal to zero.

Time t2 corresponds to the time when current Ic2 becomes smaller than clipping value k*Ic2'max. From this time on, voltage VREAD increases and is determined by relation VREAD=VCC−R1*Ic2'.

Time t3 corresponds to the time when circuit CONTROL detects that voltage VREAD becomes greater than a first voltage threshold Vref1, which means that the current in Shockley diode D1 has become smaller than a selected value. Threshold Vref1 is for example selected to be equal to VCC/2. Circuit CONTROL then turns on switch SW after having verified that voltage VREAD has passed through a substantially zero value. Due to the turning-on of switch SW, the current flowing through Shockley diode D1 and thus, current Ic2', strongly decrease. As a result, voltage VREAD strongly increases.

Time t4 corresponds to the time when circuit CONTROL detects that voltage VREAD becomes greater than a second voltage threshold Vref2. This second threshold is selected to reflect the fact that the current in Shockley diode D1 has become smaller than hold current Ih of Shockley diode D1. Circuit CONTROL then turns off switch SW and Shockley diode D1 is turned back off.

Thus, switch SW is controlled to turn off and on according to the real current flowing through Shockley diode D1 and not according to the voltage across the assembly of Shockley diode D1 and of switch SW.

An advantage of controlling the turning off of switch SW according to the real current flowing through Shockley diode D1 is that switch SW can be turned off at a selected current value by taking into account the possible above-mentioned presence of a secondary current peak at the end of an overvoltage.

Another advantage of controlling switch SW to turn off according to the real current flowing through Shockley diode D1 is that the current is not affected by high-frequency oscillations (due to the switching of parasitic inductances) as voltage $V_{AK}$ can be across the Shockley diode and switch SW on turning-on of switch SW. Thus, circuit CONTROL turns off switch SW while the current in the Shockley diode is effectively smaller than hold current Ih.

In practice, the value of the current at which switch SW is desired to be turned on is much higher (for example, 50 times higher) than value Ih. Thus, threshold voltage Vref1 at which switch SW is desired to be turned on is generally much smaller than threshold voltage Vref2 at which switch SW should be turned back off.

As an example, if first threshold Vref1 is selected to be equal to VCC/2, voltage threshold Vref2 is very close to voltage VCC, equal to VCC−ϵ, ϵ being very close to 0. It is thus difficult to distinguish threshold Vref2 from voltage VCC and circuit CONTROL risks turning switch SW off while the current in Shockley diode D1 is still greater than hold current Ih. Shockley diode D1 then remains conductive. To avoid this disadvantage, the variation described in relation with FIGS. 6 and 7 may be adopted.

Figure 6:
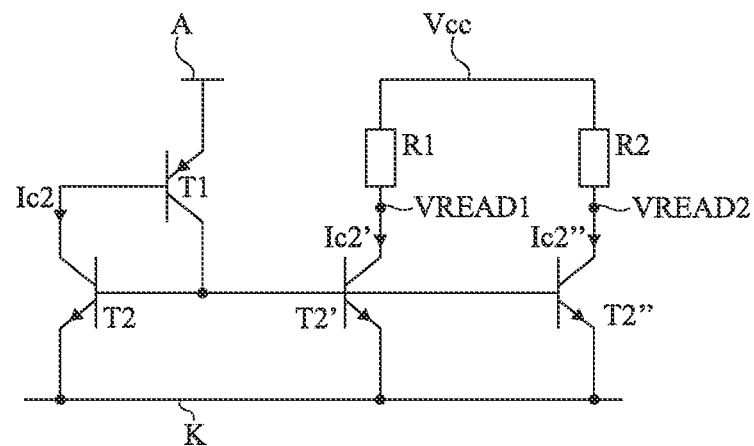
FIG. 6 is an electric diagram of an alternative embodiment of an overvoltage protection device.

FIG. 6 is an electric diagram of an alternative embodiment of component 10 described in relation with FIGS. 2 and 3. Instead of integrating a single read transistor T2' to a Shockley diode D1 as in FIG. 2, two read transistors T2' and T2" are integrated. It is thus possible to obtain high detection sensitivities for very different current values, for example, a current in the order of more than 50 A for the turning-on of switch SW and a current of less than 1 A for its turning-off.

In an embodiment, the collectors of transistors T2' and T2" have the same surface areas, k times smaller than the diode surface area, and are connected to voltage source VCC via separate resistors R1 and R2. The value of resistor R1 is smaller than the value of resistor R2.

Figure 7:
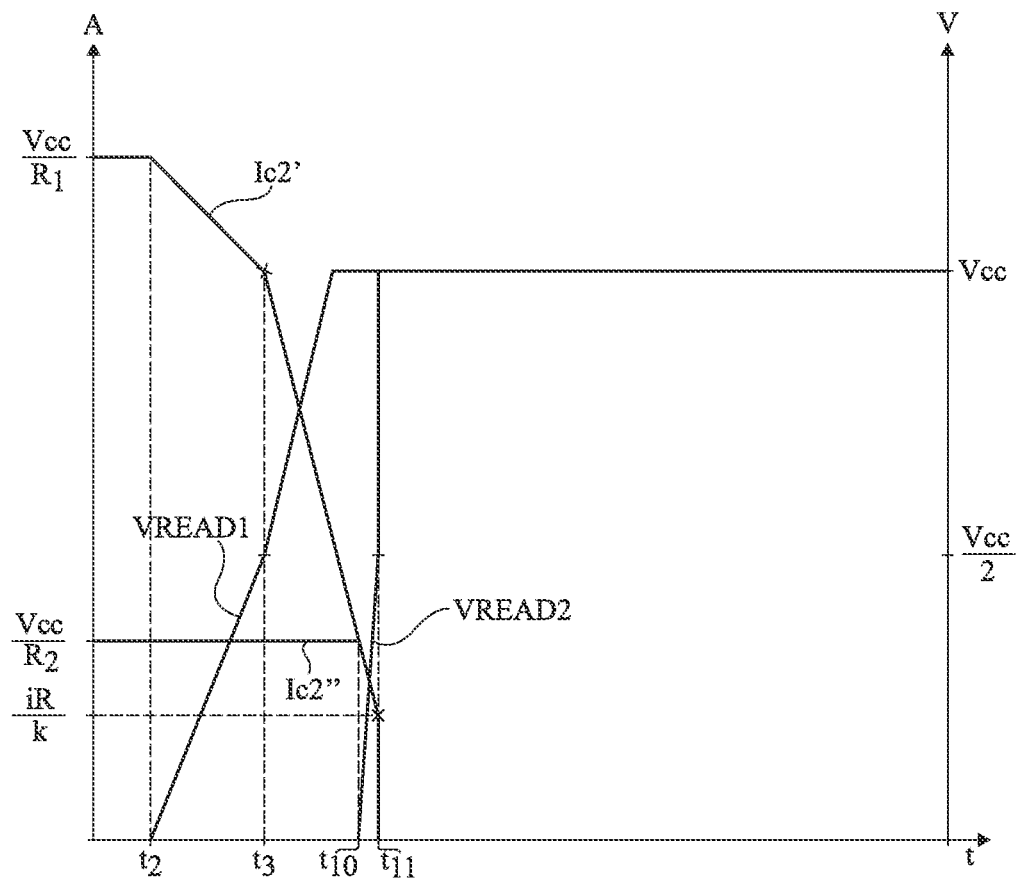
FIG. 7 is a timing diagram showing currents and voltages in the overvoltage protection device of FIG. 6 at the end of an overvoltage.

FIG. 7 is a timing diagram showing collector current Ic2' of transistor T2', collector current Ic2" of transistor T2", collector voltage VREAD1 of transistor T2', and collector voltage VREAD2 of transistor T2". Switch SW is controlled to turn on according to voltage VREAD1 and is controlled to turn off according to voltage VREAD2.

Switch SW is turned on as previously at a time t3 when collector current Ic2' of transistor T2' becomes smaller than a selected value (for example, 1/k times 50 A). Switch SW is turned off when collector current Ic2" of transistor T2" becomes smaller than 1/k times Ih (for example, 1/k times 1 A).

Before time t10, current Ic2" is clipped at a value VCC/R2 much smaller than value VCC/R1 at which current Ic2' was clipped. It is for example chosen to clip current Ic2" at value 2*$I_h$, to within factor 1/k. Thereby, voltage VREAD2 is equal to voltage threshold Vref2 equal to VCC/2 when current Ic2" is equal to 1/k times $I_h$.

At time t10, current Ic2" becomes smaller than value VCC/R2. From this time on, voltage VREAD2 increases while current Ic2" decreases.

At time t11, voltage VREAD2 becomes smaller than threshold voltage Vref2 since current Ic2" becomes smaller than 1/k times $I_h$. Switch SW is then controlled to be turned off and the diode is turned back off.

Thus, threshold Vref2 may, like threshold Vref1, be distant from voltage VCC. Switch SW is thus controlled to be turned on as well as off with no risk of error. Further, thresholds Vref1 and Vref2 may be equal, which enables to generate a single reference voltage.

Figure 8:
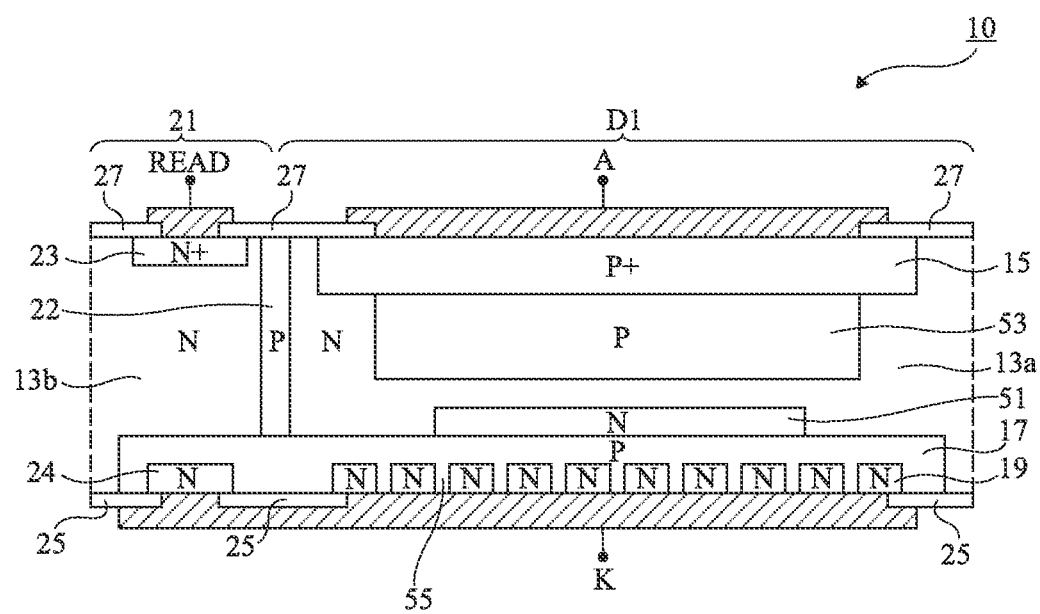
FIG. 8 is a cross-section view of a practical embodiment of a component illustrated in simplified fashion in FIGS. 2 and 3.

FIG. 8 is a cross-section view of a practical embodiment of component 10 illustrated in simplified fashion in FIGS. 2 and 3. In FIG. 8, Shockley diode D1 comprises, as previously, an N-type substrate 13a, an upper P-type layer 15, and a lower P-type layer 17 having an N-type region 19 formed therein. It further comprises an N-type region 51 in contact with the upper surface of region 17, and a P-type region 53 in contact with the lower surface of region 15. Regions 51 and 53 do not meet. Further, region 19 is provided with emitter short-circuit holes 55.

The selection of the doping levels of regions 51 and 53 and the short-circuit hole density enables to adjust breakdown voltage VBR of Shockley diode D1 and its voltage capacity.

In practice, region 53 is formed by drive-in, just as wall 22. Advantage is thus taken of the step of manufacturing region 53 to manufacture wall 22.

Specific embodiments have been described. Various alterations, modifications, and improvements will readily occur to those skilled in the art. In particular, all the above-mentioned conductivity types may be reversed. Thus, all P-type regions may be of type N and all N-type regions may be of type P.

A component where the current clipping condition in transistor T2' is determined by a resistance R1, and the current clipping condition in transistor T2" is determined by a resistance R2, the collectors of transistors T2' and T2" having the same surface areas. As a variation, the current clipping conditions in transistors T2' and T2" may be provided to also be determined by the relative surface areas of transistors T2' and T2".

Further, wall 22 has been described as being a P-type semiconductor region. Wall 22 may also correspond to an insulating trench extending from the upper surface of the structure to P-type region 17.

Further, the provision of resistors R1 and possibly R2 external to the integrated component has been described. It will be within the abilities of those skilled in the art to provide an integration of this or these resistor(s).

Switch SW may for example be a MOS transistor or an insulated gate bipolar transistor (IGBT).

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An integrated circuit, comprising:
   a vertical Shockley diode comprising from top to bottom:
      a first region of a first conductivity type,
      a substrate of a second conductivity type, and
      a second region of the first conductivity type having a third region of the second conductivity type formed therein, and
   a first vertical transistor comprising from top to bottom:
      a portion of said substrate separated from the Shockley diode by a vertical wall,
      a portion of the second region, and
      a fourth region of same conductivity type as the third region formed in said portion of the second region,
   wherein the fourth region and third region are separate regions that are separated from each other by a portion of the second region, and wherein the third region is connected to the fourth region.

2. The integrated circuit of claim 1, further comprising a second transistor of same structure as the first transistor.

3. The integrated circuit of claim 1, wherein the first transistor is located in a corner of a chip containing the Shockley diode.

4. An integrated circuit, comprising:
   a vertical Shockley diode comprising from top to bottom:
      a first region of a first conductivity type;
      a substrate of a second conductivity type; and
      a second region of the first conductivity type having a third region of the second conductivity type formed therein;
   a first vertical transistor comprising from top to bottom:
      a portion of said substrate separated from the Shockley diode by a vertical wall;
      a portion of the second region; and
      a fourth region of same conductivity type as the third region formed in said portion of the second region;
   wherein the third region is connected to the fourth region;
   a switch connected in parallel with the Shockley diode;
   a resistor having a first terminal connected to an upper main terminal of the first transistor; and
   a voltage source connected to a second terminal of said first resistor;
   the upper main terminal of the first transistor being connected to a circuit of detection and control of the switch.

5. The integrated circuit of claim 4, wherein the switch is controlled to turn on and off according to the voltage between the upper main terminal of the first transistor and the third region.

6. The integrated circuit of claim 4, further comprising:
   a second transistor of same structure as the first transistor; and
   a second resistor having a first terminal connected to an upper main terminal of the second transistor and having a second terminal connected to the voltage source,
   the upper main terminal of the second transistor being connected to a circuit of detection and control of the switch.

7. The integrated circuit of claim 6, wherein the switch is controlled to turn on according to a first voltage between the upper main terminal of the first transistor and the third region, and the switch is controlled to turn off according to a second voltage between the upper main terminal of the second transistor and the third region.

8. An integrated circuit, comprising:
   a vertical Shockley diode comprising:
      a first transistor having a first emitter, a first base and a first collector; and
      a second transistor having a second emitter, a second base connected to the first collector and a second collector connected to the first base; and
   a vertical third transistor having a third emitter connected to the second emitter, a third base connected to the second base and a third collector, such that the second transistor and the vertical third transistor form a current mirror;
   wherein the integrated circuit is implemented in a semiconductor substrate having:
      a first region of a first conductivity type forming said first emitter;
      a first substrate region of a second conductivity type forming said first base;
      a second region of the first conductivity type forming said first collector, said second base and said third base;
      a third region of the second conductivity type, formed within the second region, forming said second emitter;
      a fourth region of the second conductivity type, also formed within the second region, forming said third emitter;
      wherein the fourth region and third region are separate regions that are separated from each other by a portion of the second region; and
      a second substrate region of the second conductivity type forming said third collector.

9. The integrated circuit of claim 8, further comprising an electrical connection on a surface of the semiconductor substrate which electrically connects the third and fourth regions, wherein the electrical connection is insulated from the second region.

10. The integrated circuit of claim 8, wherein the first region, the first substrate region, the second region and the third region are arranged in the semiconductor substrate in order from a top surface of the semiconductor substrate to a bottom surface of the semiconductor substrate.

11. The integrated circuit of claim 10, wherein the second substrate region is separated from the first substrate region in the semiconductor substrate by a barrier region of the first conductivity type.

12. The integrated circuit of claim 10, wherein the second substrate region, the second region and the fourth region are arranged in the semiconductor substrate in order from the top surface of the semiconductor substrate to the bottom surface of the semiconductor substrate.

13. An integrated circuit, comprising:
   a vertical Shockley diode comprising:
      a first transistor having a first emitter, a first base and a first collector; and
      a second transistor having a second emitter, a second base connected to the first collector and a second collector connected to the first base;
   a vertical third transistor having a third emitter connected to the second emitter, a third base connected to the second base and a third collector;

a switch coupled between the first emitter and the second and third emitters; and a control circuit configured to selectively actuate said switch in response to a signal at said third collector.

14. The integrated circuit of claim 13, further comprising a resistor coupled between a supply node and said third collector.

15. The integrated circuit of claim 13, wherein said control circuit is configured to receive a first threshold voltage and a second threshold voltage, said control circuit operable to cause the switch to close when said signal has a voltage which exceeds the first threshold, said control circuit further operable to cause the switch to open when the voltage of said signal exceeds the second threshold.

16. The integrated circuit of claim 15, wherein the second threshold is greater than the first threshold.

17. An integrated circuit, comprising:
a vertical Shockley diode comprising from top to bottom:
a first region of a first conductivity type;
a substrate of a second conductivity type, and
a second region of the first conductivity type having a third region of the second conductivity type formed therein; and
a first vertical transistor comprising from top to bottom:
a portion of said substrate separated from the Shockley diode by a vertical wall;
a portion of the second region; and
a fourth region of same conductivity type as the third region formed in said portion of the second region;
an electrical connection on a surface of the substrate which electrically connects the third and fourth regions, wherein the electrical connection is insulated from the second region.

18. The integrated circuit of claim 17, further comprising a second transistor of same structure as the first transistor.

19. The integrated circuit of claim 17, wherein the first transistor is located in a corner of a chip containing the Shockley diode.

* * * * *